United States Patent
Oldham et al.

(10) Patent No.: US 7,075,699 B2
(45) Date of Patent: Jul. 11, 2006

(54) DOUBLE HIDDEN FLEXURE MICROACTUATOR FOR PHASE MIRROR ARRAY

(75) Inventors: William G. Oldham, Orinda, CA (US); Yijian Chen, Berkeley, CA (US); Yashesh Shroff, Kensington, CA (US)

(73) Assignee: The Regents of the University of California, Oakland, CA (US)

( * ) Notice: Subject to any disclaimer, the term of this patent is extended or adjusted under 35 U.S.C. 154(b) by 29 days.

(21) Appl. No.: 10/952,709

(22) Filed: Sep. 28, 2004

(65) Prior Publication Data

US 2005/0111119 A1   May 26, 2005

Related U.S. Application Data

(60) Provisional application No. 60/507,206, filed on Sep. 29, 2003.

(51) Int. Cl.
*G02B 26/00* (2006.01)
*G02B 26/08* (2006.01)
*G02B 7/182* (2006.01)

(52) U.S. Cl. .................. 359/290; 359/224; 359/849

(58) Field of Classification Search ............... 359/198, 359/214, 223, 224, 290–292, 295, 298, 846, 359/849
See application file for complete search history.

(56) References Cited

U.S. PATENT DOCUMENTS 6,360,033 B1 * 3/2002 Lee et al. .................... 385/18
6,384,952 B1 * 5/2002 Clark et al. ................. 359/224
6,791,735 B1 * 9/2004 Stappaerts ................... 359/245

OTHER PUBLICATIONS

Yijian Chen et al., "Modeling and Control of Nanomirrors for EUV Maskless Lithography," Mar. 2000, Technical Proceedings International Conference on Microsystems, San Diego, CA.

Yijian Chen et al., "Switching of a Double-Comb Microactuator by Time-Lag Modulation and Electrical-Damping Control," Nov. 15-20, 2000, MEMS Symposium, Orlando, FL.

* cited by examiner

*Primary Examiner*—Timothy Thompson
*Assistant Examiner*—William Choi
(74) *Attorney, Agent, or Firm*—Beyer Weaver & Thomas LLP

(57) ABSTRACT

Disclosed is an actuator for a phase mirror array including a) a first support member extending perpendicularly from a surface of a mirror, b) a plurality of flexures engaging the first support member with the flexures being generally parallel to the surface of the mirror, c) second and third support members engaging opposing ends of the flexures, at least one of the second and third support members functioning as a first electrode, and d) a second electrode positioned in spaced parallel relationship with the flexures, whereby a voltage impressed across the first electrode and the second electrode causes displacement of the supported mirror on the support structure. The second electrode and one of the flexures can have undulating surfaces which mate in a comb relationship.

10 Claims, 5 Drawing Sheets

(a) (b)

(c)

DOUBLE HIDDEN FLEXURE MICROACTUATOR FOR PHASE MIRROR ARRAY

CROSS-REFERENCE TO RELATED APPLICATIONS

This application claims priority under 35 U.S.C. 119(e) from Provisional U.S. Patent Application Ser. No. 60/507,206, filed Sep. 29, 2003 entitled "DOUBLE HIDDEN FLEXURE MICROACTUATOR FOR PHASE MIRROR ARRAY", which is incorporated herein by reference in its entirety.

GOVERNMENT RIGHTSCROSS-REFERENCE TO RELATED APPLICATIONS

This invention was made with Government support under Grant (Contract) No. MDA972-01-1-0021 awarded by the Defense Advanced Research Projects Agency/Office of Naval Research. The Government has certain rights to this invention.

Attached hereto and incorporated by reference for all purposes are the following papers of the inventors: Chen, Shroff, Oldham "Modeling and Control of Nanomirrors for EUV Maskless Lithography"; and Chen, Shroff, Oldham "Switching Of A Double-Comb Microactuator By Time-Lag Modulation And Electrical-Damping Control." Also attached are 16 pages of slides illustrating the invention, which are also incorporated herein by reference.

BACKGROUND OF THE INVENTION

This invention relates generally to phase mirror arrays, and more particularly the invention relates to a microactuator for a phase mirror array.

In optical displays, switches, and maskless lithography systems, patterns can be created by modulating individual mirrors in a micromirror array to produce selected bright and dark spots ("pixels") in an image. In the conventional approach, as exemplified by the Texas Instrument commercial mirror arrays, the mirror is mounted on a cantilever (FIG. 1). Selected mirrors can be tilted such that incident light from those mirrors is out of the pupil of the imaging objective. Variations on this system have been proposed including producing a "gray scale" (partial illumination of certain pixels) in the image plane. In another approach, individual mirrors, also called phase mirrors, are shifted in the plane of the mirror to produce an image by interference effects (FIG. 2).

In some applications, the phase-mirror approach produces more useful images. However, no practical approach has been proposed to construct an electrostatically actuated dense array of flat phase micromirrors of micrometer size. For example our colleagues at Stanford University are concentrating on the use of elastomers to support the mirrors (FIG. 3). Numerous problems need to be overcome to make this approach practical, including making electrical connection to the top mirror without sacrificing mirror space, finding a suitable elastomer, fabricating the device by semiconductor-compatible process steps, designing a mirror with low voltage actuation, and so forth.

SUMMARY OF THE INVENTION

The invention comprises an actuator for a phase mirror array including a) a first support member extending perpendicularly from a surface of a mirror, b) a plurality of flexures engaging the first support member with the flexures being generally parallel to the surface of the mirror, c) second and third support members engaging opposing ends of the flexures, at least one of the second and third support members functioning as a first electrode, and d) a second electrode positioned in spaced parallel relationship with the flexures, whereby a voltage impressed across the first electrode and the second electrode causes displacement of the supported mirror on the support structure. The second electrode and one of the flexures can have undulating surfaces which mate in a comb relationship.

The invention and objects and features thereof will be more readily apparent from the following detailed description and appended claims when taken with the drawings.

BRIEF DESCRIPTION OF THE DRAWINGS

FIGS. 1(a) and 1(b) are 3-D and top views of TI's mirrors, respectively. FIG. 1(c) is the double-comb micromirrors proposed for maskless lithography.

DETAILED DESCRIPTION OF THE PREFERRED EMBODIMENTS

Figure 1A:
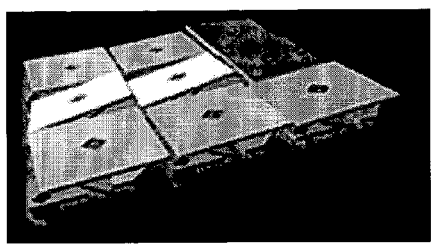
FIGS. 1A, 1B and 1C illustrate two architectures for tilting mirrors.
Figure 1B:
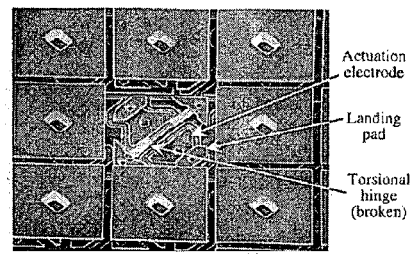
Figure 1C:
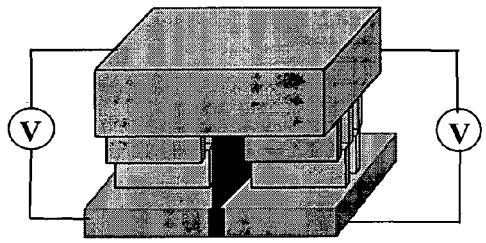
Figure 2:
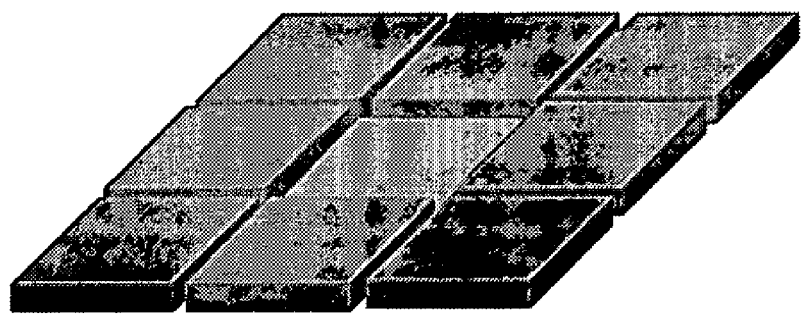
FIG. 2 is a conceptual demonstration of the phase mirror array. The middle mirror is shifted down by one quarter wavelength to create a destructive interference effect.
Figure 3:
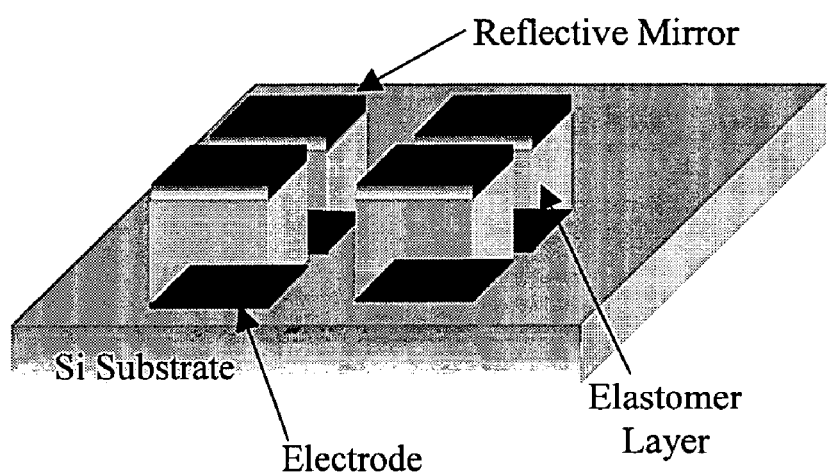
FIG. 3 illustrates phase mirror based spatial light modulators with elastomer technology.
Figure 4:
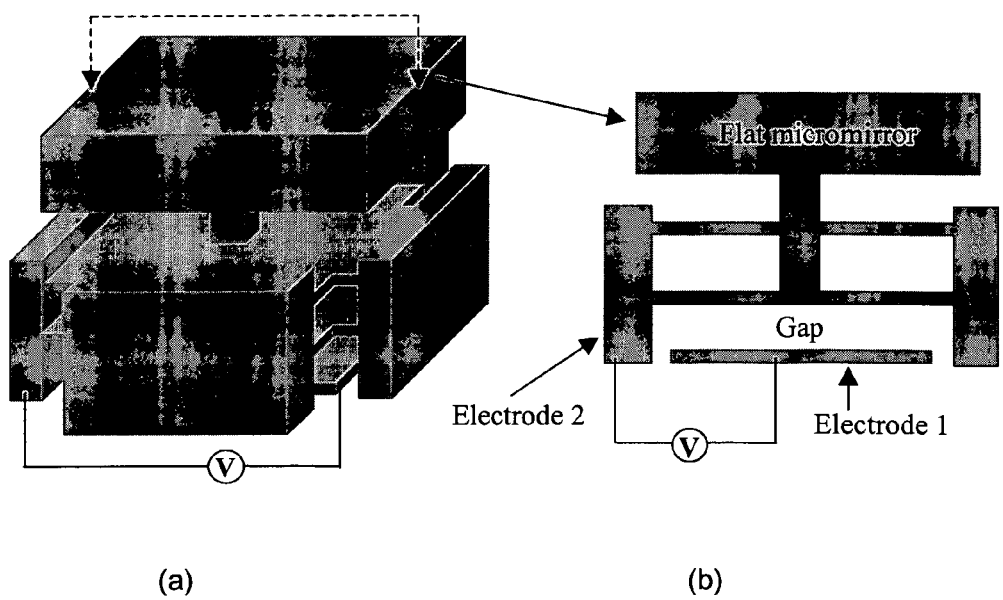
FIG. 4 illustrates the double-hidden-flexure micromirror. This clamped double-flexure structure is stiff side to side but compliant in vertical direction.
Figure 4:
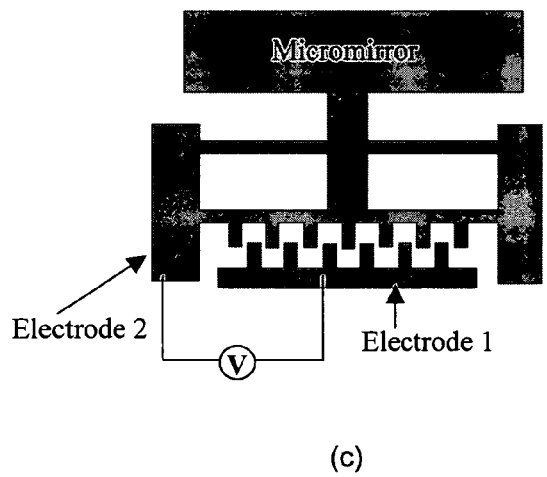
Figure 5:
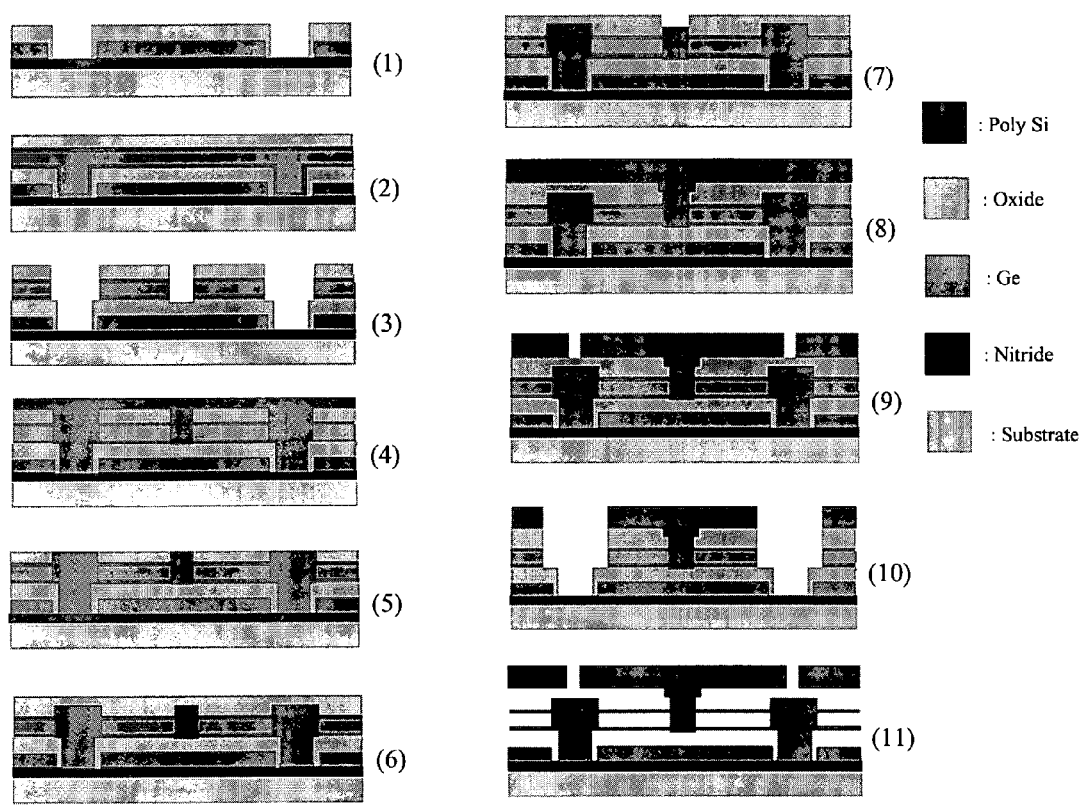
FIG. 5 illustrates the process to fabricate the double-hidden-flexure microactuators. Step (10) is to cut four small holes on the mirrors to expose and release the sacrificial materials. In final release step (11), parts of neighboring mirrors are shown on both sides.

To overcome such problems, we propose a double-hidden-flexure architecture (FIG. 4) for the phase mirrors. The mirror is supported on flexible and conducting flexures which allow the mirror to move only in the vertical direction because the structure is stiff side to side. Two possible actuating structures can be built underneath: (I) the parallel-plate actuator as shown in FIG. 4(b), and (II) the vertical comb-drive actuator as shown in FIG. 4(c). In the parallel-plate structure, no supporting material is filled in the gap which thus can be made suitably small to permit operation at low actuation voltage. The pull-in instability problem may also be overcome by this doubly-clamped beam structure due to the controllable amplitude-stiffened property of its spring constant (the beam deflection is nonlinear with the applied load.). One electrode plate is hidden underneath the horizontal supporting flexures, while the vertical supporting beams which are connected to the top mirror act as the other electrode. Since the supporting flexures are underneath the mirror, a flat and dense mirror array which is highly desirable in optical systems can be built. A further advantage of this structure is the ability to provide a resistance in the connection to mirror (e.g., a built-in resistor can be formed in the flexures with controlled doping). Such a resistance is useful in the control circuitry to provide electrical damping (to suppress the mirror vibration), especially if the mirror must be operated in a vacuum environment where air damping is precluded. In the vertical comb-drive structure, self-aligned dense combs with very small comb gaps can be fabricated using microlithography followed by a thin-film deposition of the sacrificial material. Finally, a fundamental advantage of the device is that it may be manufactured by conventional MEMS fabrication techniques, using standard semiconductor patterning and thin-film deposition techniques. An example of a process sequence to fabricate the parallel-plate structure is given in FIG. 5.

What is claimed is:

1. A phase mirror array comprising:
    a) a plurality of mirrors,
    b) a plurality of microactuators for the plurality of mirrors, each microactuator comprising:
    c) a first support member extending perpendicularly from a surface of a mirror,
    d) a plurality of flexures engaging the first support member with the flexures being generally parallel to the surface of the mirror,
    e) second and third support members engaging opposing ends of the flexures, at least one of the second and third support members functioning as a first electrode, and
    f) a second electrode positioned in spaced parallel relationship with the flexures, whereby a voltage impressed across the first electrode and the second electrode causes displacement of the supported mirror on the support structure.

2. The phase mirror array as defined by claim 1 wherein the second electrode has flat surfaces.

3. The phase mirror array as defined by claim 1 wherein the second electrode and one of the flexures have undulating surfaces which mate in a comb relationship.

4. The phase mirror array as defined by claim 1 wherein the microactuators comprise doped semiconductor material.

5. The phase mirror array as defined by claim 1 wherein the plurality of flexures is two.

6. A microactuator for a mirror in a phase mirror array comprising:
    a) a first support member extending perpendicularly from a surface of a mirror,
    b) a plurality of flexures engaging the first support member with the flexures being generally parallel to the surface of the mirror,
    c) second and third support members engaging opposing ends of the flexures, at least one of the second and third support members functioning as a first electrode, and
    d) a second electrode positioned in spaced parallel relationship with the flexures, whereby a voltage impressed across the first electrode and the second electrode causes displacement of the supported mirror on the support structure.

7. The microactuator as defined by claim 6 wherein the second electrode has flat surfaces.

8. The microactuator as defined by claim 6 wherein the second electrode and one of the flexures have undulating surfaces which mate in a comb relationship.

9. The microactuator as defined by claim 6 wherein the support members comprise doped semiconductor material.

10. The microactuator as defined by claim 6 wherein the plurality of flexures is two.

* * * * *